(12) United States Patent
Kushnarenko et al.

(10) Patent No.: US 6,469,929 B1
(45) Date of Patent: Oct. 22, 2002

(54) STRUCTURE AND METHOD FOR HIGH SPEED SENSING OF MEMORY ARRAYS

(75) Inventors: Alexander Kushnarenko, Haifa; Oleg Dadashev, Hadera, both of (IL)

(73) Assignee: Tower Semiconductor Ltd., Migdal-Haemek ( * ) Notice: Subject to any disclaimer, the term of this patent is extended or adjusted under 35 U.S.C. 154(b) by 0 days.

(21) Appl. No.: 09/935,013

(22) Filed: Aug. 21, 2001

(51) Int. Cl.[7] .............................................. G11C 16/04
(52) U.S. Cl. ............................. 365/185.06; 365/189.07; 365/203; 365/210
(58) Field of Search .................... 365/189.06, 189.07, 365/189.09, 190, 203, 210

(56) References Cited

U.S. PATENT DOCUMENTS

| | | | | |
|---|---|---|---|---|
| 5,572,465 A | * | 11/1996 | Bashir | 365/185.21 |
| 5,712,815 A | * | 1/1998 | Bill et al. | 365/189.09 |
| 5,982,666 A | * | 11/1999 | Campardo | 365/189.09 |
| 6,370,060 B2 | * | 4/2002 | Takata et al. | 365/210 |

* cited by examiner

Primary Examiner—Richard Elms
Assistant Examiner—VanThu Nguyen
(74) Attorney, Agent, or Firm—Bever, Hoffman & Harms, LLP; Jeanette S. Harms

(57) ABSTRACT

A method for sensing the state of a memory cell includes both dynamic and static clamping of the bit line coupled to a memory cell. This dual clamping configuration/operation ensures a quick charge of the bit line while eliminating overcharging of the bit line. Thus, sensing the state of the memory cell is substantially independent of the size of the memory array. A sensing system for sensing the state of a memory cell can include a system bit line coupled to a terminal of the memory cell, a charge initiation device for activating a charge operation on the system bit line, and a control unit connected between the system bit line and the charge initiation device. The control unit includes a static clamp to charge the system bit line to a first predetermined voltage and a dynamic clamp to charge the system bit line to a second predetermined voltage.

27 Claims, 6 Drawing Sheets

STRUCTURE AND METHOD FOR HIGH SPEED SENSING OF MEMORY ARRAYS

BACKGROUND OF THE INVENTION

1. Field of the Invention

The present invention relates to memory arrays, and particularly to a structure and method for high speed sensing of memory arrays.

2. Description of the Related Art

Various types of memory cells are known in the art. In general, a memory cell stores a binary digit, i.e. a logic one or a logic zero. A volatile memory cell requires a DC current to retain its logic state. Volatile memory cells can include, for example, a dynamic random access memory (RAM) that stores its logic state as a charge on a capacitor or a static RAM that includes a bi-stable flip-flop to store its logic state. A non-volatile memory cell retains its logic state even if the DC current fails. Non-volatile memory cells can include, for example, a read only memory (ROM) that includes a floating gate. This floating gate can be charged, thereby altering the threshold voltage of the memory cell. Specifically, if a floating gate of the ROM has not been charged (i.e. the memory cell is un-programmed), then the ROM has a corresponding low threshold and will turn on when selected. If the floating gate of the ROM has been charged (i.e. the memory cell is programmed), then the ROM has a corresponding high threshold and will not turn on when selected. The un-programmed and programmed memory states typically represent logic zero and logic one, respectively, of the ROM.

FIG. 1 illustrates a memory array 100 including a plurality of ROM memory cells M(R,C), wherein R refers to the row of the array and C refers to the column of the array. To read the state of a memory cell M (also called "sensing" herein), the word line WL coupled to the control gate of the memory cell M, the bit line BL coupled to the source of the memory cell M, and the bit line BL coupled to the drain of the memory cell M are selected. Specifically, for example, to sense memory cell M(3,2), a read voltage is applied to word line WL3, bit line BL3 is grounded, and bit line BL2 is coupled to a sense amplifier (not shown).

Note that all other word lines, i.e. word lines WL1, WL2, WL4, and WL5, are coupled to ground (closed) and all other bit lines, i.e. BL1, are left floating. In this manner, deselected memory cells not in the same row as M(3,2) cannot conduct because these deselected memory cells do not receive the read voltage on their gates. Moreover, deselected memory cells in the same row as the selected cell have floating drains and sources, thereby also preventing these deselected memory cells from conducting. Thus, only memory cell M(3,2) has the potential to conduct.

In a typical embodiment, the sense amplifier provides a pull-up voltage on selected bit line BL2 (called a charging operation). In this configuration, if memory cell M(3,2) is programmed, then this memory cell will not conduct. Therefore, the voltage on bit line BL2 would remain substantially at the pull-up voltage provided by the sense amplifier. If memory cell M(3,2) is un-programmed, then this memory cell will conduct, thereby pulling the voltage on bit line BL2 to ground. The sense amplifier can detect the voltage level on bit line BL2, typically by comparing it to a reference voltage, thereby allowing the state of memory cell M(3,2) to be read.

In a typical memory array, each bit line BL is connected to many memory cells M. Therefore, these bit lines have large associated parasitic capacitances. The higher the capacitance, the longer the time required to charge the selected bit line coupled to the sense amplifier. Unfortunately, charging the bit line too fast can result in overcharging, thereby undesirably lengthening the time to read the selected memory cell. Therefore, a need arises for a structure and method for quickly and efficiently charging the bit line, thereby allowing high speed sensing of the memory cell.

SUMMARY OF THE INVENTION

In accordance with the present invention, a system for sensing the state of a memory cell includes both dynamic and static clamping of the bit line coupled to the memory cell. This dual clamping configuration/operation ensures a quick charge of the bit line while eliminating overcharging of the bit line. In this manner, sensing the state of the memory cell is substantially independent of the size of the memory array.

In accordance with one embodiment, a sensing system for sensing the state of a memory cell includes a system bit line coupled to a terminal of the memory cell, a charge initiation device for activating a charge operation on the system bit line, and a control unit connected between the system bit line and the charge initiation device. The control unit includes a first circuit to charge the system bit line to a first predetermined voltage and a second circuit to charge the system bit line to a second predetermined voltage.

The first circuit includes a static clamp that charges the system bit line to a voltage defined by VB−VTN, wherein VB is a bias voltage and VTN is the threshold voltage of an n-type transistor. In one embodiment, the static clamp includes a first n-type transistor having a source coupled to the memory cell, a drain connected to the charge initiation device, and a gate receiving the bias voltage VB, wherein the bias voltage VB is defined by VTN<VB<VBLD+VTN, wherein VBLD is a desired voltage on the system bit line.

The second circuit includes a dynamic clamp that charges the system bit line from VB−VTN to VBLD. In one embodiment, the dynamic clamp includes a first p-type transistor having a source connected to the charge initiation device, a drain coupled to the memory cell, and a gate receiving a signal derived from a voltage on the system bit line. The dynamic clamp further includes a comparator receiving the voltage on the system bit line and a reference voltage, and outputting the signal derived from the voltage on the system bit line. In one embodiment, the reference voltage is equal to the desired bit line voltage.

The sensing system can further include a sense amplifier coupled to the charge initiation device. In one embodiment, the sense amplifier compares the current through the system bit line with a current through a reference system bit line. In this embodiment, the reference system bit line is coupled to a terminal of a reference memory cell. A reference charge initiation device is connected to the sense amplifier for activating a charge operation on the reference system bit line. Additionally, a reference control unit is connected between the reference system bit line and the reference charge initiation device, wherein the reference control unit includes a first reference circuit to charge the reference system bit line to the first predetermined voltage and a second reference circuit to charge the reference system bit line to the second predetermined voltage.

In accordance with one feature of the present invention, the sense amplifier can include a first stage for sensing a first current through the system bit line and a second stage for generating a first derived current from the first current. The first stage can include a first n-type transistor having a gate and a drain connected to a supply voltage and a first p-type transistor having a source connected to the supply voltage, and a gate and a drain connected to a source of the first n-type transistor and the charge initiation device. The second stage can include a second p-type transistor having a source connected to the supply voltage, a gate connected to the gate of the first p-type transistor, and a drain connected to an amplifier circuit.

The sense amplifier can further include a first reference stage for sensing a first reference current through the reference system bit line, wherein the second stage generates a second derived current from the first reference current. The first reference stage can include a first reference n-type transistor having a gate and a drain connected to the supply voltage and a first reference p-type transistor having a source connected to the supply voltage, and a gate and a drain connected to a source of the first reference n-type transistor and the reference charge initiation device. The second stage of the sense amplifier can include a second reference p-type transistor having a source connected to the supply voltage, a gate connected to the gate of the first reference p-type transistor, and a drain connected to the amplifier circuit.

In one embodiment, the amplifier circuit can include a second n-type transistor and a second reference n-type transistor. The second n-type transistor has a source connected to VSS, a drain connected to the drain of the second p-type transistor, and a gate connected to the drain of the second reference p-type transistor. The second reference n-type transistor has a source connected to VSS, a drain connected to the drain of the second reference p-type transistor, and a gate connected to the gate of the second n-type transistor. The amplifier circuit further includes a differential amplifier including a first input terminal connected to the drain of the second n-type transistor and a second input terminal connected to the drain of the second reference n-type transistor.

In the present invention, a method for charging a system bit line for sensing a memory cell is also provided. The method includes activating a charge operation on the system bit line, charging the system bit line to a first predetermined voltage using a static clamp, and charging the system bit line to a second predetermined voltage using a dynamic clamp. The first predetermined voltage is defined by VB–VTN, wherein VB is a bias voltage and VTN is a threshold voltage of an n-type transistor in the static clamp that controls a first conductive path on the system bit line. The bias voltage VB is defined by VTN<VB<VBLD+VTN, wherein VBLD is a desired voltage on the system bit line. The second predetermined voltage is equal to VBLD. The dynamic clamp compares the voltage on the system bit line to a reference voltage and controls a second conductive path on the system bit line. Of importance, the first and second conductive paths are located parallel to each other.

In one embodiment, the method of the present invention further includes activating a charge operation on a reference system bit line coupled to a reference memory cell, charging the reference system bit line to the first predetermined voltage using a reference static clamp, and charging the reference system bit line to the second predetermined voltage using a reference dynamic clamp. In this case, VTN is also a threshold voltage of an n-type transistor in the reference static clamp that controls a first reference conductive path on the reference system bit line.

The reference dynamic clamp compares a voltage on the reference system bit line to the reference voltage and controls a second reference conductive path on the reference system bit line. The first and second reference conductive paths, like the first and second conductive paths, are located parallel to each other. In this embodiment, the method includes comparing a current on the system bit line and a reference current on the reference bit line.

DETAILED DESCRIPTION OF THE DRAWINGS

Figure 1:
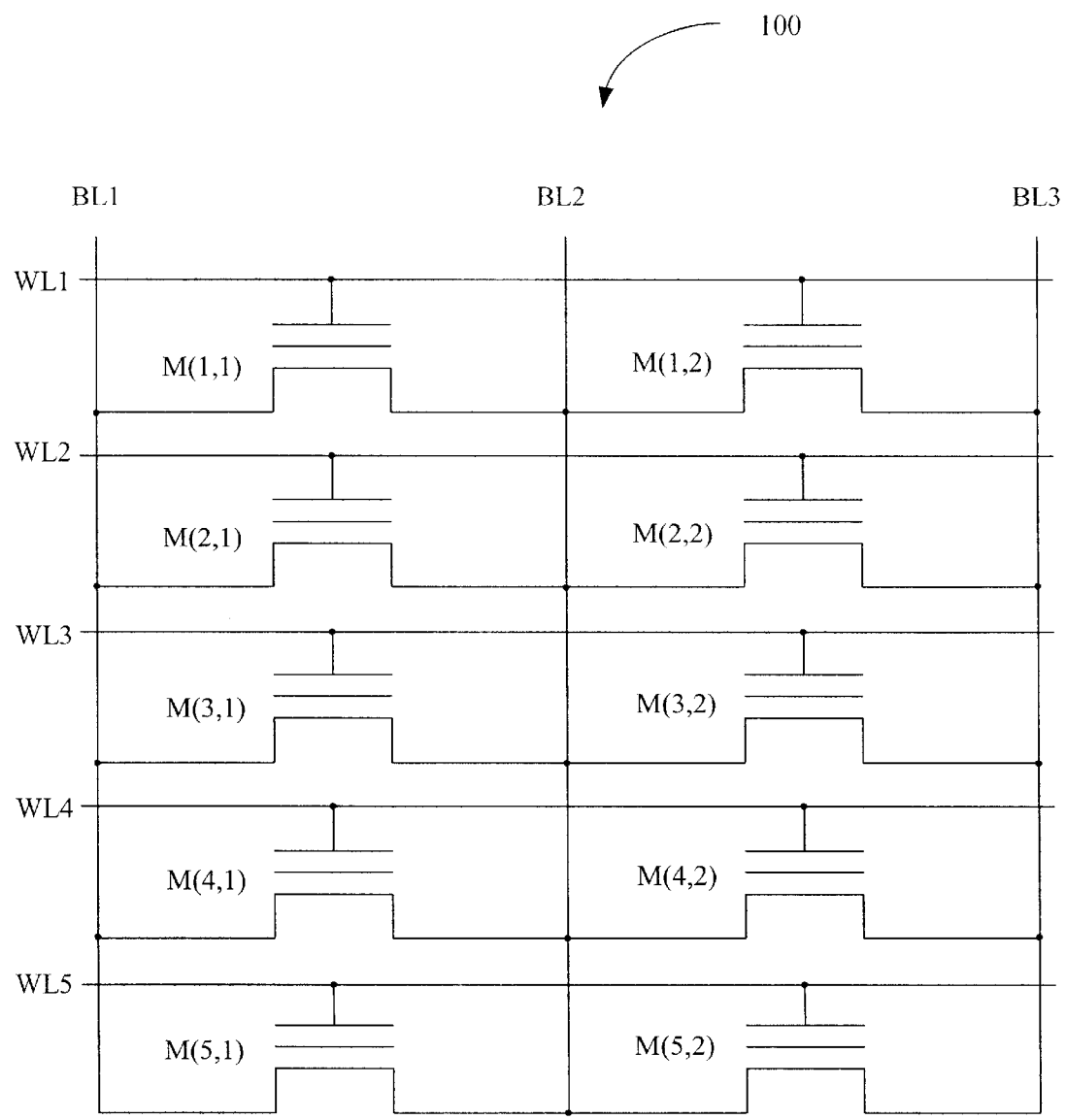
FIG. 1 illustrates a memory array including a plurality of memory cells arranged in rows and columns.
Figure 2A:
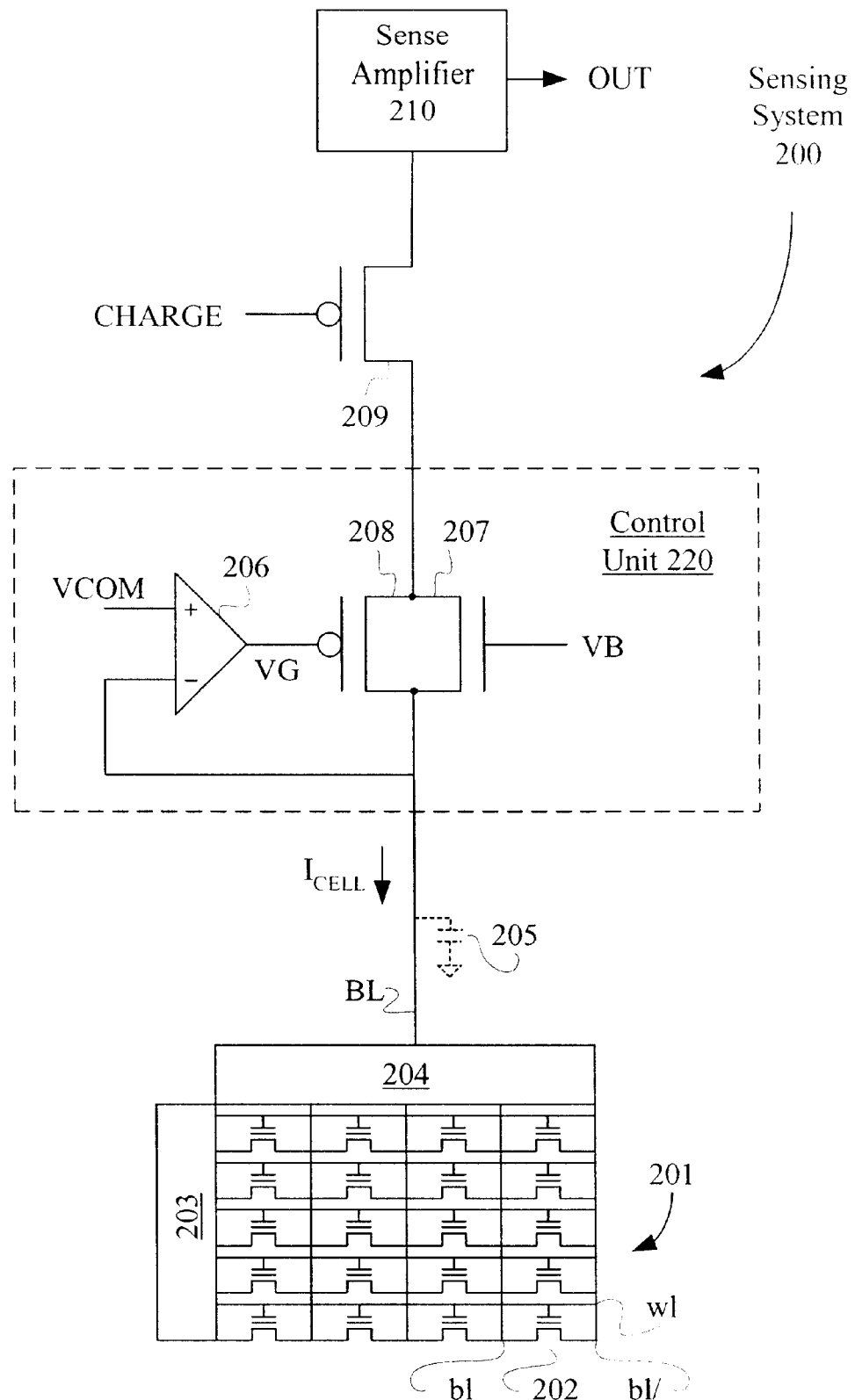
FIG. 2A illustrates a simplified diagram of a sensing system in accordance with the present invention that provides static and dynamic clamping of the bit line.

FIG. 2A illustrates a sensing system 200 for a memory array 201, which includes a plurality of memory cells arranged in rows and columns. Note that although memory array 201 includes a 4×5 array of memory cells, the present invention is equally applicable to any memory array size. For purposes of illustration, assume that a memory cell 202 is to be read (i.e. sensed). Memory cell 202 has its drain and source terminals coupled to array bit lines bl and bl/ and its control terminal coupled to a word line wl. Memory cell 202 is selectively coupled to a system bit line BL using a column decoder 204 (for selecting the array bit lines bl and bl/) and a row decoder 204 (for selecting the word line wl). Note that system bit line BL includes an associated parasitic capacitance 205 that is proportional to the number of memory cells coupled to the selected array bit line bl.

To read (i.e. sense) the state of memory cell 202 in memory array 201, the array bit line bl is coupled to the system bit line BL, the array bit line bl/ is coupled to a predetermined voltage (e.g. ground), and the word line wl is coupled to a read voltage (e.g 3 volts). Note that the operation of decoders 203 and 204 to provide the above-described coupling is well known and therefore not described in detail herein.

To ensure that a sense amplifier 210 correctly senses the logic state of memory cell 202, the system bit line BL is charged to a predetermined level before the sensing of memory cell 202. The optimal charging of the system bit line BL facilitates a quick transition to the predetermined voltage without overshooting this predetermined voltage. In one embodiment, this predetermined voltage can be approximately 2V. In accordance with the present invention, this charging operation is initiated using a charge initiation device 209 and advantageously controlled using a control unit 220 that quickly and efficiently charges the system bit line BL.

Figure 2B:
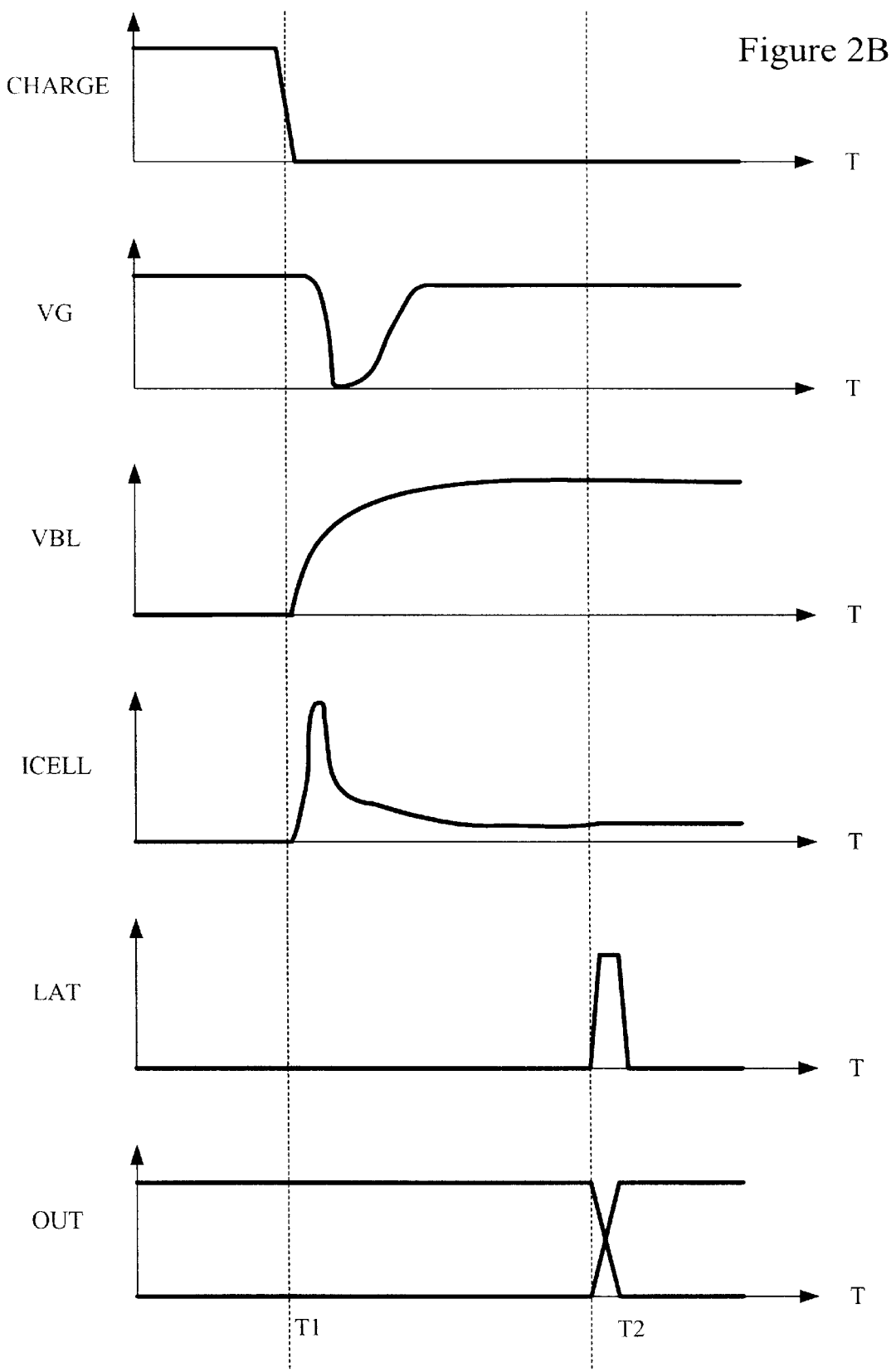
FIG. 2B illustrates various waveforms associated with the sensing system of FIG. 2A during a sensing operation.

Specifically, to initiate a charge operation, an active signal CHARGE turns on a charge initiation device 209. In one embodiment, charge initiation device 209 includes a p-type transistor, wherein the active signal CHARGE is a logic 0. FIG. 2B illustrates a waveform of this signal CHARGE transitioning from a logic 1 (a non-read state) to a logic 0 at time T1 and remaining at logic 0 through the read time immediately following time T2. When conducting, charge initiation device 209 transfers a pull-up signal provided by sense amplifier 210 (explained in detail below) to control unit 220.

In accordance with the present invention, control unit 220 comprises a static clamp including a transistor 207 and a dynamic clamp including a transistor 208. In this embodiment, the static clamp includes an n-type transistor 207 having its drain connected to charge initiation device 209 and its source connected to system bit line BL. Transistor 207 receives a bias voltage VB on its gate. In accordance with one feature of the present invention, bias voltage VB is the gate bias voltage for transistor 207 as defined by Equation 1

$$VTN < VB < VBLD + VTN \quad \text{(Equation 1)}$$

wherein VBLD is the desired voltage on bit line BL and VTN is the threshold voltage of an n-type transistor (e.g. 0.6V). In this manner, transistor 207 is conducting strongly at time T1 and charges bit line BL very quickly to VB−VTN. At this point, transistor 207 transitions to non-conducting, i.e. the static clamp deactivates, and the dynamic clamp is activated (explained below). FIG. 2B illustrates a waveform of the current ICELL through system bit line BL, which peaks soon after time T1 and then decreases to a substantially constant low-level current through read time T2. Conducting transistor 207 contributes to a majority of this peak current following time T1.

In this embodiment, the dynamic clamp of control unit 220 includes a p-type transistor 208 having its source connected to charge initiation device 209 (also the drain of transistor 207) and its drain coupled to bit line BL (also the source of transistor 207). The dynamic clamp further comprises a comparator 206, which compares a reference voltage VCOM and the bit line voltage BL and then outputs a signal VG representative of that comparison. Specifically, comparator 206 outputs a low signal VG if VBL is less than VCOM and outputs a high signal VG if VBL is greater than VCOM (or if comparator 206 is disabled). In one embodiment, the reference voltage VCOM is approximately equal to the desired bit line voltage VBLD on the system bit line BL. Of importance, transistor 208 receives the signal VG on its control gate.

FIG. 2B illustrates a waveform of signal VG, wherein before time T1, signal VG is high (i.e. comparator 206 is disabled until sense amplifier 210 is coupled to the system bit line BL) and therefore transistor 208 is not conducting. However, after time T1, the system bit line BL quickly charges to a level approximately equal to VB−VTN. This voltage change causes comparator 206 to first decrease signal VG substantially to zero, thereby quickly turning on transistor 208. In this manner, transistor 208 also contributes to the final portion of the current spike shown in FIG. 2B. Specifically, transistor 208 allows the voltage on system bit line BL to increase from VB−VTN to the desired bit line voltage VBLD.

As the voltage on system bit line BL increases to the desired bit line voltage VBLD, comparator 206 correspondingly increases signal VG, thereby decreasing the conduction of, but not turning off transistor 208. In this manner, the static and dynamic clamps of the present invention prevent system bit line BL from overcharging. Thus, referring to FIG. 2B, the waveform representing bit line voltage VBL transitions quickly and efficiently from zero to the desired bit line voltage VLBD.

Once the bit line voltage VBL and the current ICELL have stabilized, the state of memory cell 202 can be sensed. Thus, in FIG. 2B, sense amplifier 210 can sense memory cell 202 immediately following time T2 as shown by the waveform for a latch signal LAT. After latching, the state of memory cell 202 is available as an output signal OUT of sense amplifier 210 as indicated by the waveform representing that signal in FIG. 2B.

In accordance with one embodiment of the present invention, sense amplifier 210 senses the state of memory cell 202 using the current ICELL. Note that although FIGS. 3, 4, and 5 illustrate such a sense amplifier and an associated sensing system in greater detail, the present invention can be used with any type of sense amplifier and in any type of sensing system.

Figure 3:
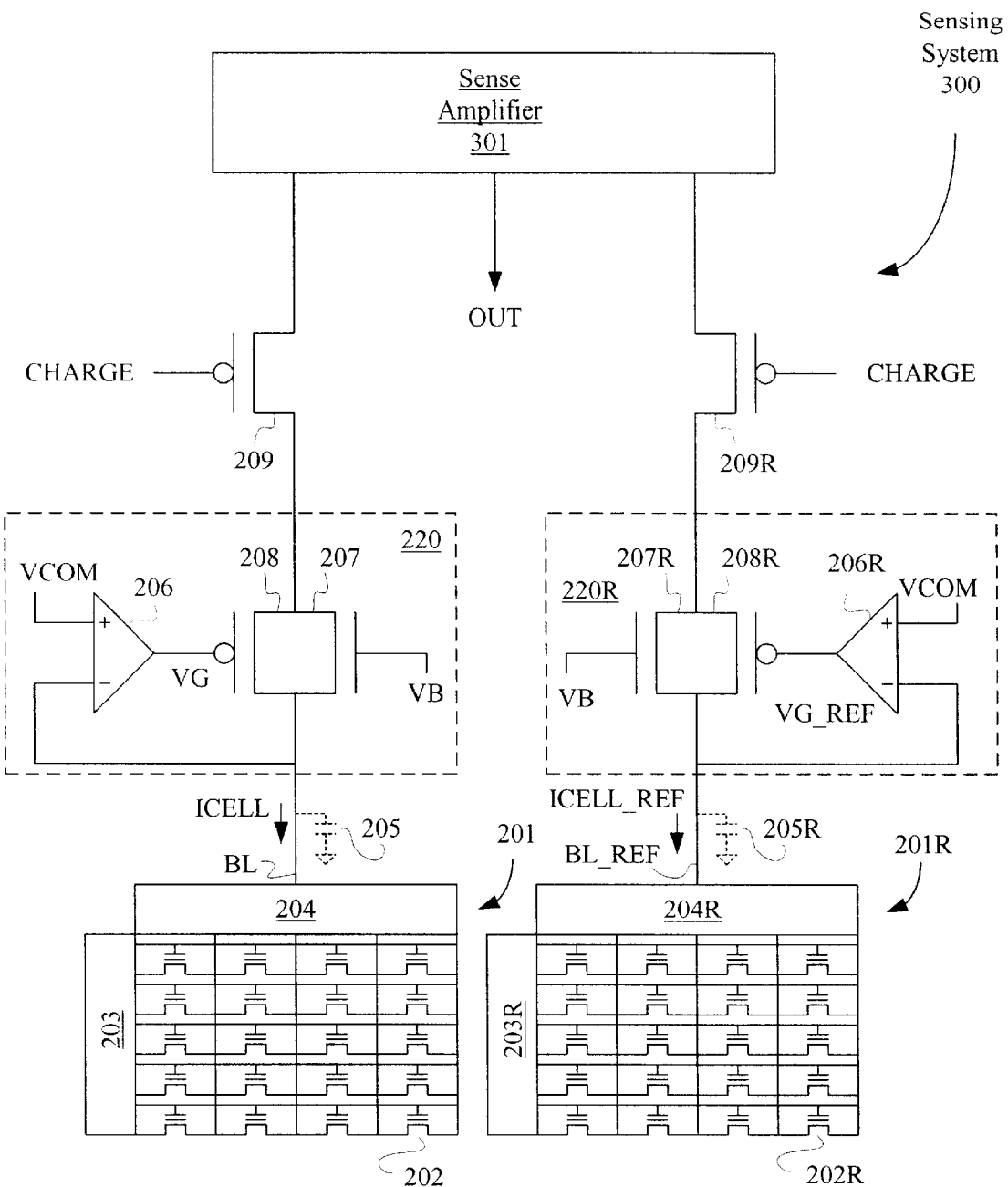
FIG. 3 illustrates a sensing system in accordance with the present invention, wherein the sensing system includes a reference memory array.

For example, FIG. 3 illustrates a sensing system 300 that includes reference devices identical to those provided in sensing system 200 (FIG. 2A). Specifically, sensing system 300 includes a control unit 220R (having static and dynamic clamps) and a charge initiation device 209R that are identical to control unit 220 and charge initiation device 209, respectively.

In one embodiment, sensing system 300 can further comprise a reference memory array 201R, which includes the same number and configuration of memory cells as memory array 201 (FIG. 2A). Memory array 201R can further include a row decoder 203R and a column decoder 204R that are identical to row decoder 203 and column decoder 204 (FIG. 2A). In another embodiment shown in FIG. 4, a sensing system 400 can replace reference memory array 201R, row decoder 203R, and column decoder 204R with a single transistor 420. In other words, by using the static and dynamic clamping configuration/operation of the present invention, concerns regarding the size of either reference memory array 201R or memory array 201 (or their associated capacitances) are virtually eliminated. In this manner, the present invention can significantly reduce the silicon area associated with a sensing system.

Figure 4:
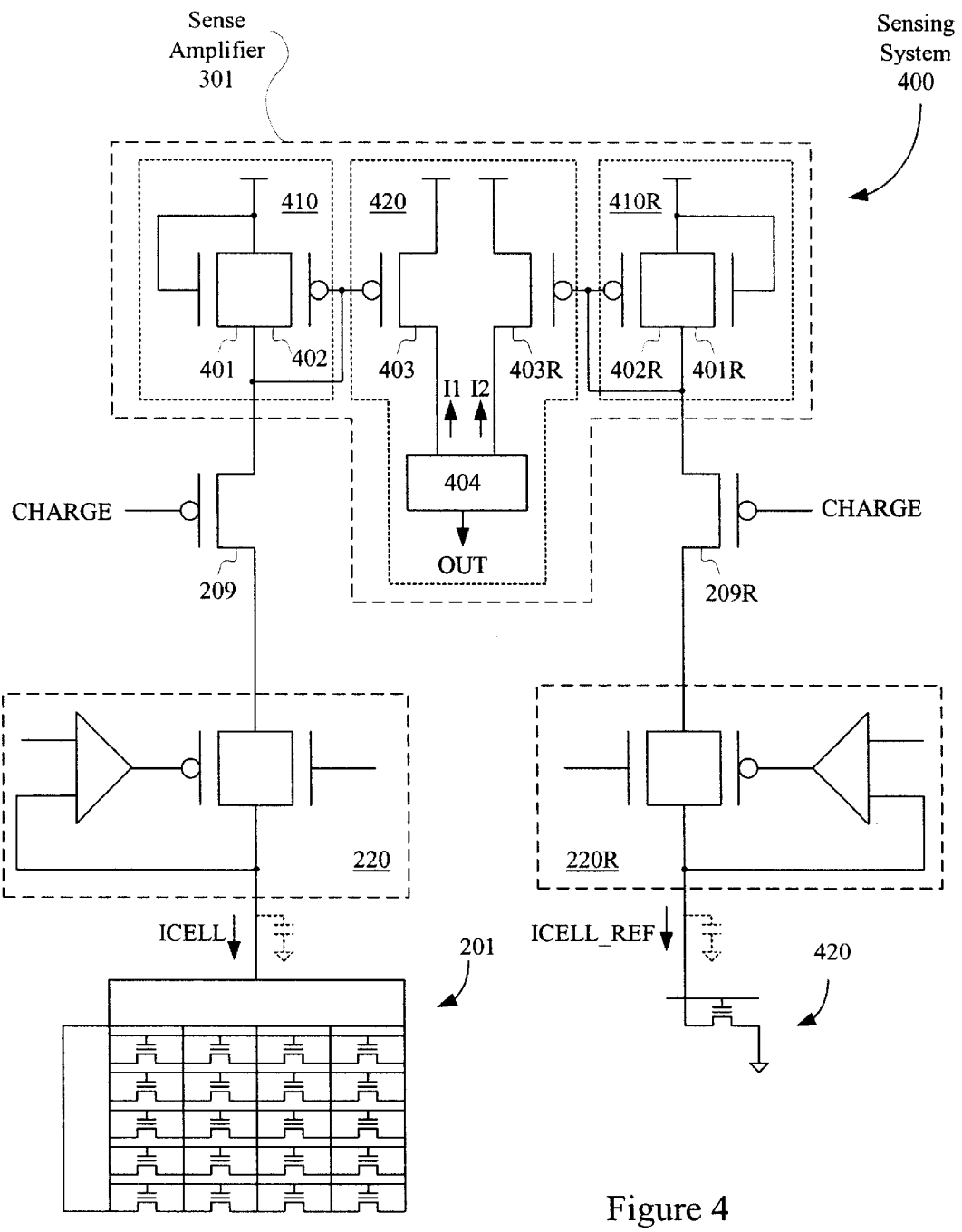
FIG. 4 illustrates further detail of a sense amplifier that can be used in the present invention.
Figure 5:
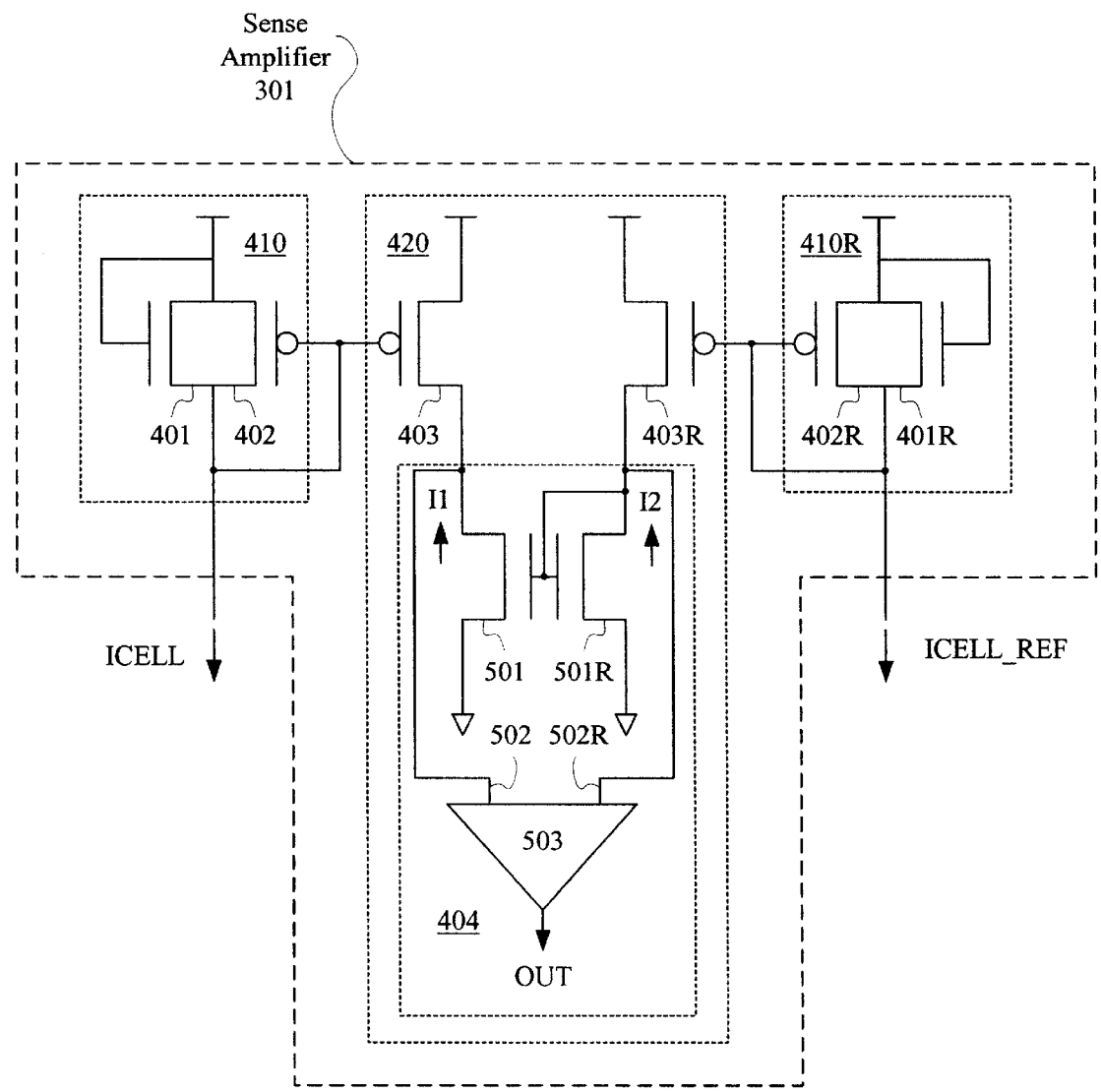
FIG. 5 illustrates yet further detail of a sense amplifier that can be used in the present invention.

In accordance with one feature of the present invention, sense amplifier 301 can detect the difference between ICELL and ICELL_REF irrespective of whether ICELL_REF is generated using memory array 201R (FIG. 3) or memory cell 420 (FIG. 4). Note that ICELL_REF can be generated by either a programmed memory cell/array or an un-programmed memory cell/array. However, the programmed/un-programmed state must be known for correct sensing.

FIG. 4 illustrates one embodiment of sense amplifier 300 that includes first stages 410/410R and second stage 420. In accordance with one feature of the present invention, first stage 410 includes a pull-up device 401 and a current sensing device 402. In this embodiment, pull-up device 401 includes an n-type transistor having its drain and gate connected to a supply voltage VDD and its source connected to charge initiation device 209. Current sensing device 402 includes a p-type transistor having its drain and gate connected to charge initiation device 209 and its source connected to the supply voltage VDD. Note that in this configuration, current sensing device 402 advantageously functions as a diode, which is explained in further detail below.

First stage 410R has an identical configuration to first stage 410. Specifically, first stage 410R includes a pull-up device 401R and a current sensing device 402R. In this embodiment, pull-up device 401R includes an n-type transistor having its drain and gate connected to supply voltage VDD and its source connected to charge initiation device 209R. Current sensing device 402R includes a p-type transistor having its drain and gate connected to charge initiation device 209R and its source connected to supply voltage VDD. Note that in this configuration, current sensing device 402R also advantageously functions as a diode.

After charge initiation device 209 is activated, both pull-up transistor 401 and current sensing device 402 conduct strongly. In accordance with one feature of the present invention, current sensing device 402 has a relatively high resistance to provide optimal sensitivity to current changes on system bit line BL. In one embodiment, current sensing device 402 has a width of 1 micron and a length of 5 microns to provide the desired resistance. Unfortunately, this resistance counters the fast charging of system bit line BL. Specifically, at the beginning of the charge operation, current sensing device 402 can cause an undesirable drop in the bit line voltage VBL.

To prevent this voltage drop, pull-up transistor 401 is sized as a low resistance transistor with a higher threshold voltage than current sensing device 402. For example, in one embodiment, pull-up transistor 401 has a width of 5 microns and a length of 0.5 microns. In this embodiment, pull-up transistor 401 has a threshold voltage 100 mV greater than current sensing device 402.

Thus, in this configuration, during the charge operation, the system bit line BL initially receives a pull-up voltage of VDD−VTN via pull-up transistor 401. Then, via current sensing device 402, the voltage on the system bit line BL increases to VDD−VTP, wherein VTP is the threshold voltage of a p-type transistor. Note that the voltage VDD−VTP is substantially equal to the desired system bit line voltage VBLD. At this point, this increased voltage on the system bit line BL turns off pull-up transistor 401. Because current sensing device 402 is connected as a diode, only current ICELL is detected. Therefore, depending on the state of the sensed memory cell, a predetermined current can flow through current sensing device 402.

First stage 410R functions identically to and substantially simultaneously with first stage 410. Specifically, after charge initiation device 209R is activated, both pull-up transistor 401R and current sensing device 402R conduct strongly. Current sensing device 402R and pull-up transistor 401R are preferably sized identically to current sensing device 402R and pull-transistor 401, respectively, to provide similar characteristics.

Thus, in this configuration, during the charge operation, the reference system bit line BL_REF initially receives a pull-up voltage of VDD−VTN via pull-up transistor 401R. Then, via current sensing device 402R, the voltage on the reference system bit line BL_REF increases to VDD−VTP. At this point, this increased voltage on the reference system bit line BL_REF turns off pull-up transistor 401R. Because current sensing device 402R is connected as a diode, only current ICELL_REF is measured. Therefore, depending on the state of the sensed reference memory cell, a predetermined current can flow through current sensing device 402R.

In accordance with one feature of the present invention, current sensing devices 402 and 402R in first stages 410 and 410R, respectively, have current mirrors provided in second stage 420. Specifically, the current ICELL through current sensing device 402 is reflected in the current I1 through a p-type transistor 403, whereas the current ICELL_REF through current sensing device 402R is reflected in the current I2 through a p-type transistor 403R. Note that current sensing devices 402/402R and source transistors 403/403R must share common operation characteristics and therefore are all p-type transistors in this case. The ratio of the currents through current sensing device 402 and p-type transistor 403 defines the gain of first stage 410, whereas the ratio of the current through current sensing device 402R and p-type transistor 403R defines the gain of first stage 410R. Note that the gain of first stage 410 should be identical to the gain of first stage 410R. At this point, an amplifier block 404 can amplify and compare currents I1 and I2.

FIG. 5 illustrates one embodiment of amplifier block 404 including a differential amplifier 503 that amplifies and compares currents I1 and I2 via lines 502 and 502R, respectively. Note that amplifier block 404 further includes an n-type transistor 501 having a source connected to ground and a drain connected to the drain of p-type transistor 403. In a similar configuration, amplifier block 404 also includes an n-type transistor 501 having a source coupled to ground and a drain coupled to the drain of p-type transistor 403R. The gates of ntype transistors 501/501R are coupled to the drain of p-type transistor 403R. N-type transistors 501/501R work with p-type transistors 403/403R to generate currents I1/I2, as is well known to those skilled in the art. Differential amplifier 503 can include any standard operational amplifier configured to amplify the difference between two input signals and to output a signal OUT based on this difference.

Various embodiments for a memory array sensing system in accordance with the present invention have been described. Although the invention has been described in connection with those embodiments, it is understood that the present invention is not limited to such embodiments. Specifically, various modifications to those embodiment as well as other embodiments may be apparent to those skilled in the art in light of the detailed disclosure herein. For example, although the present invention has been described with reference to a memory array including ROM cells, the present invention is equally applicable to any type of memory cell array. Therefore, the present invention is limited only by the scope of the appended claims.

What is claimed is:

1. A sensing system for sensing a state of a memory cell, the sensing system comprising:
   a system bit line coupled to a terminal of the memory cell
      a charge initiation device for activating a charge operation on the system bit line; and
   a control unit connected between the system bit line and the charge initiation device, wherein the control unit includes a first circuit to charge the system bit line to a first predetermined voltage and a second circuit to charge the system bit line to a second predetermined voltage.

2. The sensing system of claim 1, wherein the first circuit includes a static clamp.

3. The sensing system of claim 2, wherein the first predetermined voltage is defined by VB−VTN, wherein VB is a bias voltage and VTN is the threshold voltage of an n-type transistor.

4. The sensing system of claim 3, wherein the static clamp includes a first n-type transistor having a source coupled to the memory cell, a drain connected to the charge initiation device, and a gate receiving the bias voltage V B, wherein the bias voltage VB is defined by VTN<VB<VBLD+VTN, wherein VBLD is a desired voltage on the system bit line.

5. The sensing system of claim 2, wherein the second circuit includes a dynamic clamp.

6. The sensing system of claim 5 wherein the second predetermined voltage is a desired voltage on the system bit line.

7. The sensing system of claim 6, wherein the dynamic clamp includes a first p-type transistor having a source connected to the charge initiation device, a drain coupled to the memory cell, and a gate receiving a signal derived from a voltage on the system bit line.

8. The sensing system of claim 7, wherein the dynamic clamp further includes a comparator receiving the voltage on the system bit line and a reference voltage, and outputting the signal derived from the voltage on the system bit line.

9. The sensing system of claim 8, wherein the reference voltage is approximately equal to the desired voltage on the system bit line.

10. The sensing system of claim 1, further including a sense amplifier connected to the charge initiation device.

11. The sensing system of claim 10, further including:
a reference system bit line coupled to a terminal of a reference memory cell;
a reference charge initiation device for activating a charge operation on the reference system bit line, the reference charge initiation device connected to the sense amplifier; and
a reference control unit connected between the reference system bit line and the reference charge initiation device, wherein the reference control unit includes a first reference circuit to charge the reference system bit line to the first predetermined voltage and a second reference circuit charge the reference system bit line to the second predetermined voltage.

12. The sensing system of claim 11, wherein the sense amplifier includes a first stage for sensing a first current through the system bit line and a second stage for generating a first derived current from the first current.

13. The sensing system of claim 12, wherein the first stage includes a first n-type transistor having a gate and a drain connected to a supply voltage and a first p-type transistor having a source connected to the supply voltage, and a gate and a drain connected to a source of the first n-type transistor and the charge initiation device.

14. The sensing system of claim 13, wherein the second stage includes a second p-type transistor having a source connected to the supply voltage, a gate connected to the gate of the first p-type transistor, and a drain connected to an amplifier circuit.

15. The sensing system of claim 14, wherein the sense amplifier further includes a first reference stage for sensing a first reference current through the reference system bit line, wherein the second stage generates a second derived current from the first reference current.

16. The sensing system of claim 15, wherein the first reference stage includes a first reference n-type transistor having a gate and a drain connected to the supply voltage and a first reference p-type transistor having a source connected to the supply voltage, and a gate and a drain connected to a source of the first reference n-type transistor and the reference charge initiation device.

17. The sensing system of claim 16, wherein the second stage includes a second reference p-type transistor having a source connected to the supply voltage, a gate connected to the gate of the first reference p-type transistor, and a drain connected to the amplifier circuit.

18. The sensing system of claim 17, wherein the amplifier circuit includes a second n-type transistor and a second reference n-type transistor, the second n-type transistor having a source connected to VSS, a drain connected to the drain of the second p-type transistor, and a gate connected to the drain of the second reference p-type transistor, the second reference n-type transistor having a source connected to VSS, a drain connected to the drain of the second reference p-type transistor, and a gate connected to the gate of the second n-type transistor, wherein the amplifier circuit further includes a differential amplifier including a first input terminal connected to the drain of the second n-type transistor and a second input terminal connected to the drain of the second reference n-type transistor.

19. A method for charging a system bit line for sensing a memory cell, the method comprising:
activating a charge operation on the system bit line;
charging the system bit line to a first predetermined voltage using a static clamp; and
charging the system bit line to a second predetermined voltage using a dynamic clamp.

20. The method of claim 19, wherein the first predetermined voltage is defined by VB−VTN, wherein VB is a bias voltage and VTN is a threshold voltage of an n-type transistor in the static clamp that controls a first conductive path on the system bit line.

21. The method of claim 20, wherein the bias voltage VB is defined by VTN<VB<VBLD+VTN, wherein VBLD is a desired voltage on the system bit line.

22. The method of claim 21, wherein the second predetermined voltage is VBLD.

23. The method of claim 22, wherein the dynamic clamp compares a voltage on the system bit line to a reference voltage and controls a second conductive path on the system bit line, wherein the first and second conductive paths are located parallel to each other.

24. The method of claim 23, further including:
activating a charge operation on a reference system bit line coupled to a reference memory cell;
charging the reference system bit line to the first predetermined voltage using a reference static clamp; and
charging the reference system bit line to the second predetermined voltage using a reference dynamic clamp.

25. The method of claim 24, wherein VTN is a threshold voltage of an n-type transistor in the reference static clamp that controls a first reference conductive path on the reference system bit line.

26. The method of claim 25, wherein the reference dynamic clamp compares a voltage on the reference system bit line to the reference voltage and controls a second reference conductive path on the reference system bit line, wherein the first and second reference conductive paths are located parallel to each other.

27. The method of claim 26, further including comparing a current on the system bit line and a reference current on the reference system bit line.

* * * * *